United States Patent
Mule'Stagno et al.

(10) Patent No.: US 6,635,587 B1
(45) Date of Patent: Oct. 21, 2003

(54) METHOD FOR PRODUCING CZOCHRALSKI SILICON FREE OF AGGLOMERATED SELF-INTERSTITIAL DEFECTS

(75) Inventors: Luciano Mule'Stagno, St. Louis, MO (US); Jeffrey L. Libbert, O'Fallon, MO (US); Joseph C. Holzer, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/661,821

(22) Filed: Sep. 14, 2000

Related U.S. Application Data

(60) Provisional application No. 60/175,478, filed on Jan. 11, 2000, and provisional application No. 60/155,725, filed on Sep. 23, 1999.

(51) Int. Cl.⁷ ............................................. H01L 21/26
(52) U.S. Cl. .................... 438/795; 438/308; 438/471; 438/797; 438/800
(58) Field of Search .......................... 438/308, 471, 438/475, 794, 795, 796, 797, 798, 799, 800

(56) References Cited

U.S. PATENT DOCUMENTS

| | | | |
|---|---|---|---|
| 4,266,986 A | * 5/1981 | Benton et al. | 148/1.5 |
| 4,314,595 A | 2/1982 | Yamamoto et al. | |
| 4,344,815 A | * 8/1982 | Cazarra et al. | 156/601 |
| 4,376,657 A | 3/1983 | Nagasawa et al. | |
| 4,437,922 A | 3/1984 | Bischoff et al. | |
| 4,505,759 A | 3/1985 | O'Mara | |
| 4,548,654 A | 10/1985 | Tobin | |
| 4,575,466 A | * 3/1986 | Iwai et al. | 437/53.1 |
| 4,851,358 A | 7/1989 | Huber | |
| 4,868,133 A | 9/1989 | Huber | |
| 4,929,564 A | * 5/1990 | Kainosho et al. | 437/20 |
| 4,981,549 A | 1/1991 | Yamashita et al. | |
| 5,264,189 A | 11/1993 | Yamashita et al. | |
| 5,401,669 A | 3/1995 | Falster et al. | |

(List continued on next page.)

FOREIGN PATENT DOCUMENTS

| | | |
|---|---|---|
| EP | 0 536 958 A1 | 4/1993 |
| EP | 0 503 816 B1 | 9/1996 |
| JP | 3-009078 | 2/1991 |
| JP | 7-201874 A | 8/1995 |
| JP | 8-045945 A | 2/1996 |
| JP | 9-199416 A | 7/1997 |
| JP | 11-067781 A | 3/1999 |
| JP | 11-150119 A | 6/1999 |
| WO | 98-45507 A1 | 10/1998 |
| WO | 98-45508 A1 | 10/1998 |
| WO | 98-45509 A1 | 10/1998 |
| WO | 98-45510 A1 | 10/1998 |
| WO | 00-08677 A1 | 2/2000 |
| WO | 00-13211 A1 | 3/2000 |
| WO | 00-34999 A1 | 6/2000 |

OTHER PUBLICATIONS

A.J.R. de Kock, "The Elimination of Vacancy–Cluster Formation in Dislocation–Free Silocon Crystals", *J. Electrochem. Soc., Solid State Science*, Nov. 1971, pp. 1851–1856.

(List continued on next page.)

*Primary Examiner*—Matthew Smith
*Assistant Examiner*—Renzo N. Rocchegiani
(74) *Attorney, Agent, or Firm*—Senniger, Powers, Leavitt & Roedel

(57) ABSTRACT

A process for heat treating a silicon wafer to dissolve B-type agglomerated interstitial defects present therein. The process includes heating the silicon wafer at a temperature for a time sufficient to dissolve B-defects, the wafer being heated to said temperature at a rate sufficient to prevent B-defects from becoming stabilized such that these defects are rendered incapable of being dissolved.

55 Claims, 4 Drawing Sheets

U.S. PATENT DOCUMENTS

| | | | |
|---|---|---|---|
| 5,403,406 A | 4/1995 | Falster et al. | |
| 5,487,354 A | 1/1996 | Von Ammon et al. | |
| 5,502,010 A | 3/1996 | Nadahara et al. | |
| 5,502,331 A | 3/1996 | Inoue et al. | |
| 5,534,294 A | 7/1996 | Kubota et al. | |
| 5,591,668 A * | 1/1997 | Maegawa et al. | 437/174 |
| 5,593,494 A | 1/1997 | Falster | |
| 5,611,855 A | 3/1997 | Wijaranakula | |
| 5,667,584 A | 9/1997 | Takano et al. | |
| 5,674,756 A | 10/1997 | Satoh et al. | |
| 5,704,973 A | 1/1998 | Sakurada et al. | |
| 5,728,211 A | 3/1998 | Takano et al. | |
| 5,788,763 A | 8/1998 | Hayashi et al. | |
| 5,935,320 A | 8/1999 | Graef et al. | |
| 5,939,770 A | 8/1999 | Kageyama | |
| 5,944,889 A | 8/1999 | Park et al. | |
| 5,954,873 A | 9/1999 | Hourai et al. | |
| 5,968,262 A | 10/1999 | Saishouji et al. | |
| 5,968,264 A | 10/1999 | Iida et al. | |
| 5,980,720 A | 11/1999 | Park et al. | |
| 5,994,761 A | 11/1999 | Falster et al. | |
| 6,045,610 A | 4/2000 | Park et al. | |
| 6,153,008 A | 11/2000 | Von Ammon et al. | |
| 6,326,284 B1 * | 12/2001 | Miura et al. | 438/452 |

OTHER PUBLICATIONS

Nikolai I. Puzanov et al., "The effect of thermal history during crystal growth oxygen precipitation in Czochralski–grown on silicon", *Semicond. Sci. Technol.*, 7 (1992), pp. 406–413.

Nikolai I. Puzanov et al., "Modelling microdefect distribution in dislocation–free Si–crystals grown from the melt", *Journal of Crystal Growth*, 178 (1997), pp. 468–478.

W. Wijaranakula et al., "Effect of high–temperature annealing on the dissolution of the D–defects in n–type Czochralski silicon", *Applied Physics Letters* 64 (8), Feb. 21, 1994, pp. 1030–1032.

PCT/US 00/25524 International Search Report dated Jan. 19, 2001.

English Abstract of Japanese Patent Publication No. 7–321120.

English Abstract of Japanese Patent Publication No. 7–335657.

English Abstract of Japanese Patent Publication No. 8–045944.

English Abstract of Japanese Patent Publication No. 8–045947.

English Abstract of German Publication No. 43 23 964.

Abe, T. and Kobayashi, N., "Defect–Free Surfaces of Bulk Wafers by Combination of RTA and Crystal Growth Conditions", Publication information unknown.

Abe, T., "Innovated Silicon Crystal Growth and Wafering Technolgies", Electrochemical Society Proceedings, (1997), pp. 123–133, vol. 97, No. 3.

Chiou, H–D, "The Effects of Preheatings on Axial Oxygen Precipitation Uniformity in Czochralski Silicon Crystals", J. Electrochem. Soc., (1992), pp. 1680–1684, vol. 139, No. 6, The Electrochemical Society, Inc.

De Kock, A.J.R., et al., "Effect of Growth Parameters on Formation and Elimination of Vacancy Clusters in Dislocation–Free Silicon Crystals", Journal of Crystal Growth, (1974), pp. 311–320, vol. 22, North–Holland Publishing Co.

Dornberger, E., et al., "Simulation on Grown–In Voids in Czochralski Silicon Crystals", Electrochemical Society Proceedings, pp. 40–49, vol. 97, No. 22.

Falster, R., "The Engineering of Silicon Wafer Material Properties Through Vacancy Concentration Profile Control and the Achievement of Ideal Oxygen Precipitation Behavior", Mat. Res. Soc. Symp. Proc., (1998), pp. 27–35, vol. 510, Materials Research Society.

Föll, et al., "The Formation of Swirl Defects in Silicon by Agglomeration of Self–Interstitials", Journal of Crystal Growth, (1977), pp. 90–108, vol. 40, North–Holland Publishing Company.

Hara, A., et al., "Enhancement of Oxygen Precipitation in Quenched Czochralski Silicon Crystals", J. Appl. Phys., (1989), pp. 3958–3960, vol. 66, No. 8, American Institute of Physics.

Hawkins, G.A., et al., "Effect of Rapid Thermal Processing on Oxygen Precipitation in Silicon", Mat. Res. Soc. Symp. Proc., (1988), pp. 197–200, vol. 104, Materials Research Society.

Hawkins, G.A., et al., "The Effect of Rapid Thermal Annealing on the Precipitation of Oxygen in Silicon", J. Appl. Phys., (1989), pp. 3644–3654, vol. 65, No. 9, American Institute of Physics.

Jacob, M., et al., "Determination of Vacancy Concentrations in the Bulk of Silicon Wafers by Platinum Diffusion Experiments", (1997), pp. 182–191, vol. 82, No. 1, American Institute of Physics.

Jacob, M., et al., "Influence of RTP on Vacancy Concentrations", (1998), pp. 129–133, vol. 490, Materials Research Society.

Kissinger, G., et al., "A Method for Studying the Growth–In Defect Density Spectra in Czochralski Silicon Wafers", J. Electrochem. Soc., pp. 1447–1456, (1997), vol. 144, No. 4, Published by The Electrochemical Society, Inc.

Mule'Stagno, L., et al., "Gettering of Copper in Bonded Silicon Wafers", Electrochemical Society Proceedings, pp. 176–182, vol. 96, No. 3.

Nadahara, S., et al., "Hydrogen Annealed Silicon Wafer", Solid State Phenomena, (1997), pp. 19–26, Scitec Publications, Switzerland Pagani, M., et al., "Spatial Variations in Oxygen Precipitation in Silicon After High Temperature Rapid Thermal Annealing", Appl. Phys. Lett., (1997), pp. 1572–1574, vol. 70, No. 12, American Institute of Physics.

Puzanov, N.I. et al., "Relaxation in a System of Point Defects in a Growing Dislocation–Free Crystal of Silicon", Sov. Phys, Crystallogr., (1986), pp. 219–222, vol. 31, No. 2, American Institute of Physics.

Shimura, Fumio, "Microdefects", Semiconductor Silicon Crystal Technology, (1989), pp. 282–284, Published by Academic Press Limited, London.

Sinno, T., et al., "Point Defect Dynamics and the Oxidation–Induced Stacking–Fault Ring in Czochralski–Grown Silicon Crystals", J. Electrochem. Soc., (1998), pp. 302–318, vol. 145, No. 1, The Electrochemical Society, Inc.

Yamagishi, H., et al., "Recognition of D Defects in Silicon Single Crystals by Preferential Etching and Effect on Gate Oxide Integrity", Semicond. Sci. Technol., (1992), pp. A135–A140, vol. 7, IOP Publishing Ltd.

Zimmermann, H., et al., "Gold and Platinum Diffusion: The Key to the Understanding of Intrinsic Point Defect Bahavior in Silicon", Applied Physics A Solids and Surfaces, (1992), pp. 121–eoa, vol. A55, No. 1.

* cited by examiner

 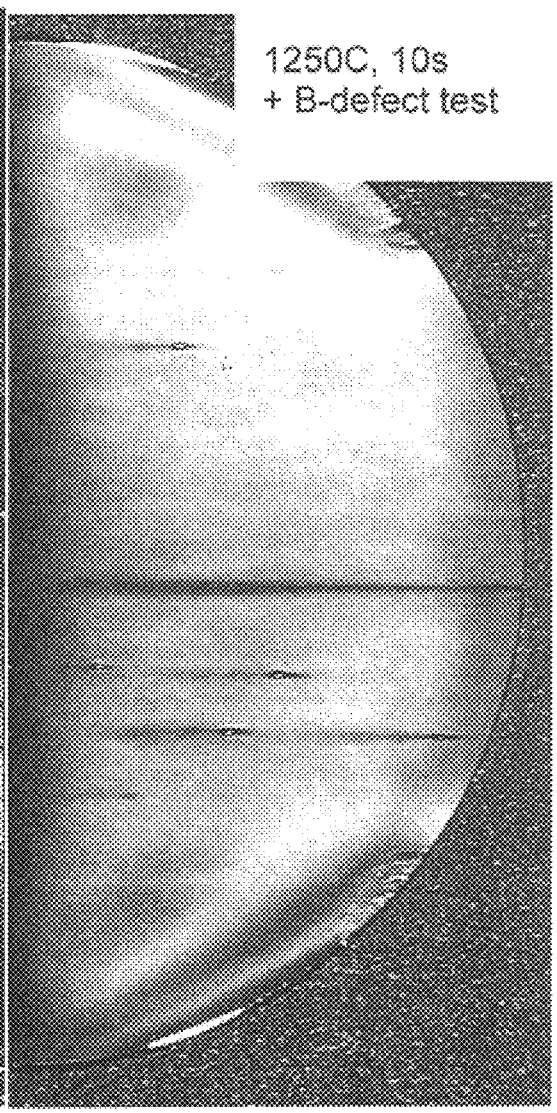
Fig. 1(a) No Heat Treat + B-defect test
Fig. 1(b) 1250C, 10s + B-defect test Fig. 2(a): Wafer 1
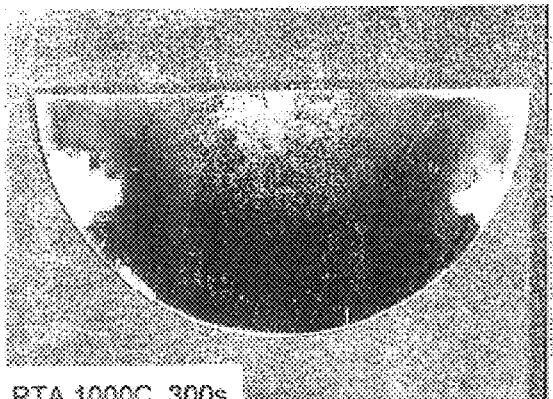
Fig. 2(b): Wafer 2
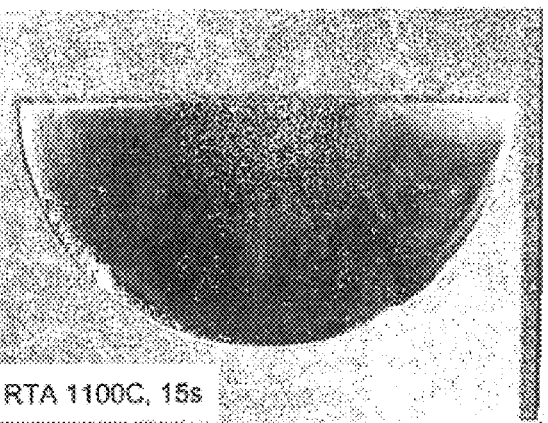
Fig. 2(c): Wafer 3
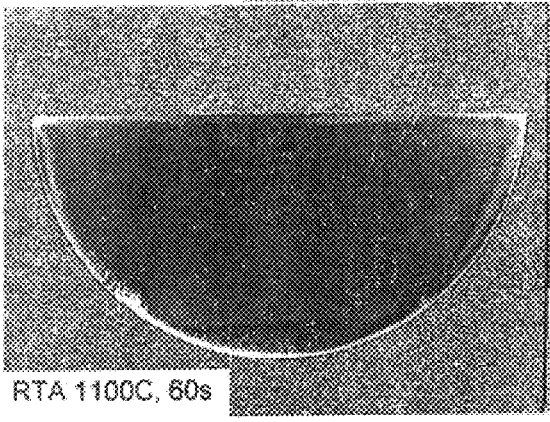
Fig. 2(d): Wafer 4
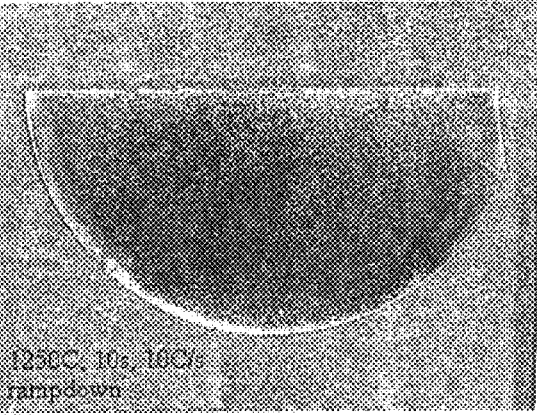

Fig. 2(e): Wafer 5
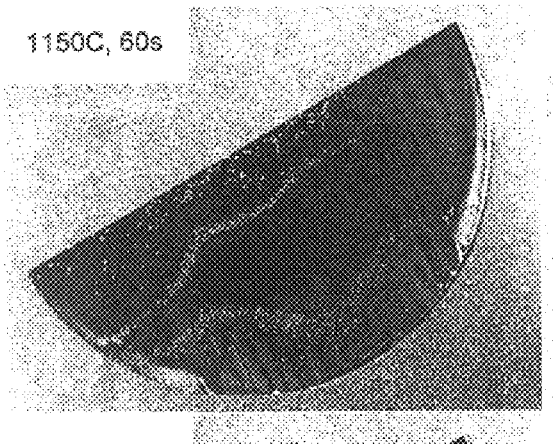
Fig. 2(g): Wafer 7
Fig. 2(f): Wafer 6
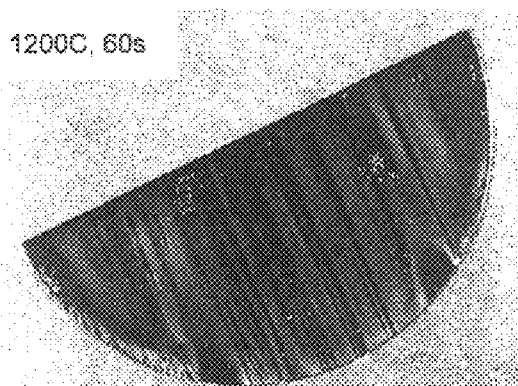
Fig. 2(h): Wafer 8

Fig. 2(i): Wafer 9    Fig. 2(j): Wafer 10
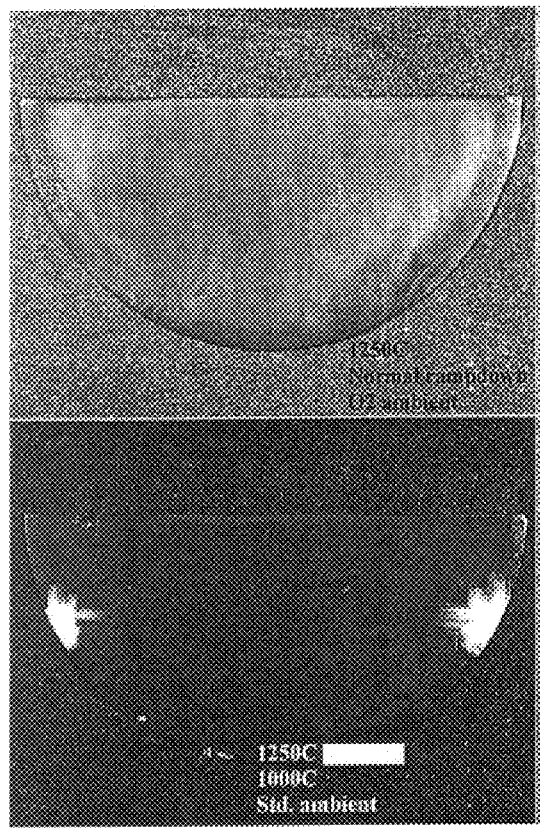 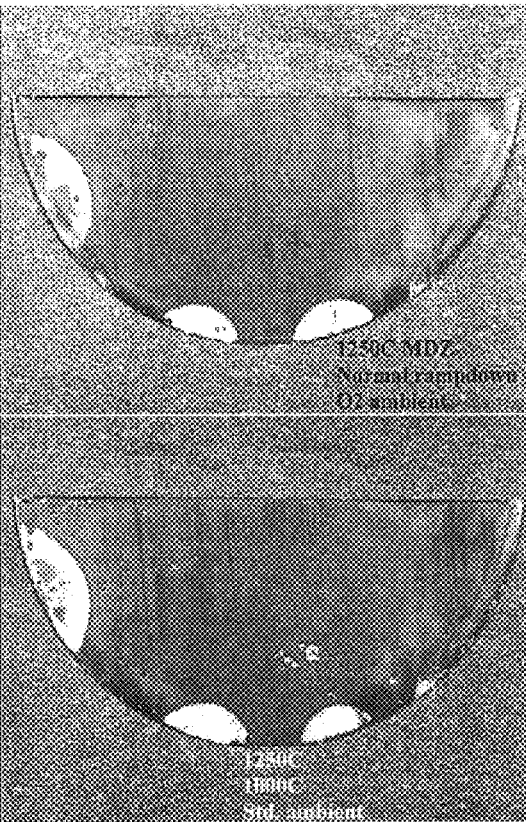
Fig. 2(k): Wafer 11    Fig. 2(l): Wafer 12

METHOD FOR PRODUCING CZOCHRALSKI SILICON FREE OF AGGLOMERATED SELF-INTERSTITIAL DEFECTS

REFERENCE TO RELATED APPLICATION

This application claims priority from U.S. provisional application, U.S. Ser. No. 60/155,725, filed on Sep. 23, 1999 and U.S. provisional application, U.S. Ser. No. 60/175,478, filed on Jan. 11, 2000.

BACKGROUND OF THE INVENTION

The present invention generally relates to the preparation of semiconductor material substrates, especially silicon wafers, which are used in the manufacture of electronic components. More particularly, the present invention relates to a heat treatment process for annihilating B-type silicon self-interstitial agglomerated defects in single crystal silicon.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon, and then a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process, but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the crystal growth chamber as the crystal cools after solidification. Such defects arise, in part, due to the presence of an excess (i.e., a concentration above the solubility limit) of intrinsic point defects, which are known as silicon lattice vacancies and silicon self-interstitials. It is understood that the type and initial concentration of these point defects in the silicon, which become fixed at the time of solidification, are controlled by the conditions under which the single crystal silicon ingot is grown. (See, e.g., PCT/US98/07365 and PCT/US98/07304.) If the concentration of such point defects reaches a level of critical supersaturation within the single crystal silicon, and if the mobility of the point defects is sufficiently high, a reaction, or an agglomeration event, will likely occur.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques, such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

Defects relating to self-interstitials are less well studied, however, two types of self-interstitial defects have been observed and are commonly referred to as A-defects and B-defects (or A- and B- "swirls" or "clusters"). A-defects are larger and more easily detected by means common in the art, as compared to B-defects. A-defects are generally regarded as being low densities of interstitial-type dislocation loops or networks. Less is known about B-defects, primarily because they are much smaller in size and also because, until recently, methods for easily and reliably detecting such defects have not existed. However, at least some believe that B-defects are not dislocation loops but rather are loosely packed three-dimensional agglomerates of silicon self-interstitials and impurity atoms of some kind. (See, e.g., F. Shimura, *Semiconductor Silicon Crystal Technology*, Academic Press, Inc., San Diego Calif. (1989) at pages 282–284 and the references cited therein.)

Although A- and B-defects are not believed to be responsible for gate oxide integrity failures, an important wafer performance criterion, A-defects at least are widely recognized to be the cause of other types of device failures usually associated with current leakage problems. Less is known about the problems associated with B-defects. However, as device technology continues to improve, thus enabling the preparation of even smaller integrated circuitry, these smaller interstitial defects will naturally become the focus of greater concern. Accordingly, a need continues to exist for the means by which to prepare silicon wafers which are free of both A-type and B-type agglomerated interstitial defects.

SUMMARY OF THE INVENTION

Among the several objects and features of the present invention may be noted the provision of a process of annihilating B-defects from single crystal silicon; the provision of a process for producing a single crystal silicon wafer which is substantially free of B-defects; the provision of a process wherein a silicon wafer substantially free of A-defects is rendered substantially free of B-defects; the provision of a single crystal silicon wafer substantially free of both A- and B-defects; and, the provision of a process for producing an ideal precipitating single crystal silicon wafer which is substantially free of B-defects.

Briefly, therefore, the present invention is directed to a process for heat treating a silicon wafer to dissolve B-defects present therein. The process comprises subjecting the wafer to a B-defect dissolution heat-treatment, wherein the wafer temperature is increased through a range of temperatures at which B-defects can grow and can become stabilized, at a heating rate sufficient to prevent the stabilization of the B-defects to a heat-treatment temperature of at least about 1000° C. and maintaining the wafer at the heat-treatment temperature for a time period sufficient to dissolve the B-defects.

The present invention is further directed to a process for heat-treating a single crystal silicon wafer to dissolve B-defects and to influence the precipitation behavior of oxygen in the wafer in a subsequent thermal processing step. The process comprises subjecting the wafer to a B-defect dissolution heat-treatment, wherein the wafer temperature is increased through a range of temperatures at which B-defects can grow and can become stabilized, at a heating rate sufficient to prevent the stabilization of the B-defects to a heat-treatment temperature of at least about 1000° C. Then maintaining the wafer at the heat-treatment temperature for a time period sufficient to dissolve the B-defects and controlling the cooling rate of the heat-treated wafer to cause the formation of a vacancy concentration profile in the wafer, in which the peak density is at or near the central plane with the concentration generally decreasing in the direction of the front surface of the wafer and the difference in the concentration of vacancies in the front surface and bulk layers being such that a thermal treatment at a temperature in excess of 750° C., is capable of forming in the wafer a denuded zone in the front surface layer and oxygen clusters or precipitates in the bulk layer with the concentration of the oxygen clusters or precipitates in the bulk layer being primarily dependant upon the concentration of vacancies.

Other objects and features of this invention will be in part apparent and in part pointed out hereinafter.

BRIEF DESCRIPTION OF THE DRAWINGS

FIGS. 1a and 1b are images of a portion of a single crystal silicon wafer, following copper decoration and a defect-delineating etch as further described in detail below, comparing a portion of the wafer having B-defects before being subjected to a heat-treatment of the present invention (FIG. 1a) to a portion the wafer after being subjected to a heat-treatment of the present invention (FIG. 1b), as discussed in Example 1.

FIGS. 2(a) through 2(l) are images of a portion of a single crystal silicon wafers that were subjected to various heat treatment conditions as described in Example 1, and subsequently subjected to a copper decoration and a defect-delineating etch as further described in detail.

DETAILED DESCRIPTION OF THE PREFERRED EMBODIMENTS

In accordance with the process of the present invention, it has been discovered that B-type agglomerated silicon self-interstitial intrinsic point defects (hereinafter B-defects) in single crystal silicon may be dissolved, or annihilated, by heat treating the silicon containing them. Without being held to any particular theory, it is generally believed that A-type agglomerated silicon self-interstitial intrinsic point defects (hereinafter A-defects) are formed when agglomerations of interstitial defects collapse to form dislocation loops or stacking faults. In contrast, B-defects are smaller in size as compared to A-defects and are generally believed to be agglomerations which have either not grown large enough or not reached a sufficient activation energy, such that dislocation loops or stacking faults are formed. As a result, B-defects may be dissolved by heating the silicon, effectively causing these defects to disassociate into independent silicon self-interstitials, the resulting silicon self-interstitials rapidly diffusing to the silicon surface. The rapid "out diffusion" of interstitials acts to lower the overall concentration of interstitials such that, upon subsequent cooling of the silicon, re-agglomeration does not occur, effectively rendering the silicon substantially free of B-defects.

The starting material for the process of the present invention may be any silicon in which B-defects are present. Typically, the starting material is a single crystal silicon wafer having a central axis, a front side and a back side which are generally perpendicular to the central axis, a circumferential edge, and a radius extending from the central axis to the circumferential edge of the wafer of at least about 25, 50, 75, 100, or 150 mm or greater, which has been sliced from a single crystal ingot grown in accordance with conventional Czochralski crystal growing methods. The wafer may be a polished silicon wafer, or alternatively, a silicon wafer which has been lapped and etched but not polished. In addition, the wafer may have different axially symmetric regions in which vacancy or self-interstitial point defects are the predominant intrinsic point defect. For example, the wafer may be self-interstitial dominated from center to edge, or it may contain a central core of vacancy dominated material surrounded by an axially symmetric ring of self-interstitial dominated material. Preferably, however, the starting material is a single crystal silicon wafer which is self-interstitial dominated from center to edge and which is substantially free of A-defects (see, e.g., PCT/US98/07365 and PCT/US98/07305, both incorporated herein by reference).

According to the present invention, a single crystal silicon wafer is subjected to a heat-treatment step in which the wafer is heated to a temperature of at least about 1000° C. for a time sufficient to dissolve B-defects, effectively rendering the wafer substantially free of such defects. However, it is to be noted that experience to-date suggests B-defects cannot be dissolved if these defects have first been subjected to a stabilizing thermal treatment. Stated another way, it is generally believed that while B-defects may be dissolved by heating the silicon which contains them, such defects may not be dissolved if they have previously been subjected to a thermal treatment wherein the silicon has been exposed to a relatively low temperature for an extended period of time. For example, experience to-date suggests that annealing the silicon at a temperature ranging from about 500° C. to less than about 1000° C. for about two to about four hours or greater can stabilize the B-defects, such that they are incapable of being dissolved. It is to be noted in this regard, however, that B-defects may be stabilized if exposed to temperatures less than about 500° C. However, exposure times greater than about 4 hours would be required. It is to be further noted that exposure to temperatures ranging from about 900° C. to about 1000° C. may result in the growth and eventual transformation of B-defects into A-defects, at which point these defects are also rendered incapable of being dissolved.

In view of the foregoing, B-defects are dissolved in accordance with the present process by ensuring that the silicon which contains them is heated to a temperature and for a time sufficient to dissolve these defects, while ensuring the silicon is not first exposed to conditions which would result in their stabilization. More specifically, in accordance with the present process, a silicon sample is heated to a temperature in excess of about 1000° C. (i.e., a temperature sufficient to dissolve B-defects), while ensuring that the rate at which the silicon reaches this temperature is not such that the B-defects are effectively stabilized against dissolution in the process. Generally speaking, the silicon is heated to a temperature in excess of about 1000° C., preferably about 1100° C., more preferably about 1150° C., still more preferably about 1200° C., and most preferably about 1250° C.

The silicon sample is maintained at the target temperature for a time period sufficient to dissolve B-defects which are present. Generally speaking, in a first embodiment, the sample may be heated in a rapid thermal annealer for a few seconds (e.g., at least about 2, 3, 5 or more), several tens of seconds (e.g., 10, 20, 30, 40, 50 or more) or, depending upon the desired characteristics of the wafer and the target temperature, for a period of up to about 60 seconds (which is near the limit of commercially available rapid thermal annealers). In this regard it is to be noted that longer time periods for the heat treatment correspond to lower temperatures and vice versa. Accordingly, a wafer heated to a temperature of 1000° C. will take considerably longer for the B-defects to dissolve than a wafer heated to a temperature of, for example, 1200° C.

The time and temperature combination sufficient for B-defect dissolution may be determined empirically by, for example, heating a series of wafers at a given temperature for varying periods of time and then analyzing the wafers, as further described below, in order to determine if B-defects are present.

The temperature of the wafer is typically increased at a rate, through the range of temperatures at which stabilization of B-defects can occur, which is sufficient to avoid this stabilization; that is, the wafer is typically heated at a rate which ensures it is not exposed to a temperature ranging from about 500° C. to less than about 1000° C. for a time period sufficient to result in the stabilization of B-defects. Accordingly, preferably the temperature is increased at a rate of at least about 5° C./second, more preferably at least about 10° C./second, still more preferably at least about 15° C./second, still more preferably at least about 20° C./second, and most preferably at least about 25° C./second.

The heat treatment may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

In a second embodiment of the present invention, an ideal precipitating wafer which is substantially free from B-defects is produced. More specifically, an ideal precipitating wafer which is substantially free of B-defects may be prepared using the ideal precipitating wafer process process, as disclosed in U.S. Pat. No. 5,994,761 (incorporated herein by reference), that process being modified in that, during the wafer heat-treatment step (i.e., step $S_2$ of embodiment one, for example), the wafer is heated to a temperature and for a time sufficient to dissolve B-defects as described above. More specifically, in the second embodiment of the present invention, the wafer is heat treated in accordance with the first embodiment wherein the increase in temperature through the temperature at which B-defects become stabilized is sufficient to reach the temperature at which B-defects begin to dissolve prior to the B-defects becoming stabilized. After holding the wafer at or above the temperature of dissolution for a time period sufficient to dissolve the B-defects as described in the first embodiment, the wafer is then cooled in accordance with the ideal precipitating wafer process as described in U.S. Pat. No. 5,994,761, wherein the cooling rate is controlled, such that the resulting wafer is an ideal precipitating wafer that is substantially free of B-defects.

It is to be noted that while control of the cooling rate is a factor in obtaining an ideal precipitating wafer, it is not narrowly critical for purposes of obtaining a wafer substantially free of B-defects. Stated another way, the cooling rate after B-defect dissolution is not narrowly critical to the present invention because, due to the high rate of diffusivity of self-interstitials, these intrinsic point defects will diffuse to the surface before the wafer can cool enough to cause defect agglomeration and precipitation to occur.

It is to be further noted that czochralski-grown silicon typically has an oxygen concentration within the range of about $5 \times 10^{17}$ to about $9 \times 10^{17}$ atoms/cm³ (ASTM standard F-121-83). Experimental evidence to date suggests that an oxygen concentration falling within the range attainable by the Czochralski process does not effect the annihilation of B-defects. Furthermore, because the oxygen precipitation behavior of the wafer becomes essentially decoupled from the oxygen concentration in the ideal precipitating wafer, the starting wafer may have an oxygen concentration falling anywhere within or even outside the range attainable by the Czochralski process, when the ideal precipitating wafer process is employed.

Substitutional carbon, when present as an impurity in single crystal silicon, has the ability to catalyze the formation of oxygen precipitate nucleation centers. For this and other reasons, therefore, it is preferred that the single crystal silicon starting material have a low concentration of carbon. That is, the single crystal silicon should have a concentration of carbon which is less than about $5 \times 10^{16}$ atoms/cm³, preferably which is less than $1 \times 10^{16}$ atoms/cm³, and more preferably less than $5 \times 10^{15}$ atoms/cm³. While the carbon concentrations listed herein are desirable for producing ideal precipitating wafers, it should be noted that the carbon concentration may exceed these levels without adversely affecting the annihilation of B-defects. Thus for purposes of the present invention, the carbon concentration is not narrowly critical except when producing an ideal precipitating wafer.

Visual Detection of Agglomerated Interstitial Defects

Agglomerated interstitial defects may be detected by applying a quantity of a highly concentrated solution, or paste, such as copper nitrate to the surface of the sample, then heating the sample at a temperature for a period of time which is sufficient to allow the metal to diffuse into the silicon matrix, then etching the sample with a non-delineating etch, rinsing the sample, and then etching the surface of the sample with a defect delineating etch and finally, visually inspecting the surface of the sample for the presence of metal decorated interstitial defects. While this method is capable of detecting both A-type and B-defects, the B-defects may be partially or completely dissolved during the initial heating step. Therefore, the sample is preferably subjected to a thermal anneal to stabilize the B-defects prior to applying the metal containing solution or paste. A more detailed description of a method by which both A-type and B-defects are detected may be found in U.S. provisional application, U.S. Ser. No. 60/175,506 incorporated herein by reference.

DEFINITIONS

It is to be noted that, as used herein, the following phrases shall have the given meanings: "agglomerated intrinsic point defects" shall mean defects caused (i) by the reaction in which vacancies agglomerate or (ii) by the reaction in which self-interstitials agglomerate; "agglomerated vacancy defects" shall mean agglomerated vacancy point defects caused by the reaction in which crystal lattice vacancies agglomerate, examples include D-defects, flow pattern defects, gate oxide integrity defects, crystal originated particle defects, and crystal originated light point defects; "agglomerated interstitial defects" shall mean agglomerated intrinsic point defects caused by the reaction in which silicon self-interstitial atoms agglomerate to form A-defects (including dislocation loops and networks) and B-defects; "B-defects" shall mean agglomerated interstitial defects which are smaller than A-defect and which are capable of being dissolved if subjected to a heat treatment as further described herein; "radius" shall mean the distance measured from a central axis to a circumferential edge of a single crystal silicon sample, such as a wafer, or an ingot slug or slab; "substantially free of agglomerated intrinsic point defects" shall mean a concentration of agglomerated defects which is less than the detection limit of these defects, which is currently about $10^4$ defects/cm$^3$; "vacancy dominated" and "self-interstitial dominated" shall mean material in which the intrinsic point defects are predominantly vacancies or self-interstitials, respectively; and, "visual detection of agglomerated intrinsic point defects," as well as variations thereof, shall refer to the detection of such defects using the naked eye under ordinary incandescent or fluorescent light sources, or optionally collimated or other enhanced light sources, and without the use of any instrumentation which would otherwise aid in defect detection or result in defect magnification, such as optical or infrared microscopy, X-ray diffraction, or laser scattering.

EXAMPLES

The following examples set forth one set of conditions that may be used to achieve the desired result. Accordingly, these examples should not be interpreted in a limiting sense.

Example 1

A silicon single crystal ingot was pulled by the Czochralski method. The ingot was then sliced and polished to form silicon wafers. Wafers throughout a section of the crystal, which had received a 5 second, 950° C. rapid thermal process (hereinafter RTP) heat treatment were confirmed to contain B-defects using the B-defect delineating test discussed earlier.

A wafer from the ingot was separated into two sections after which one section was subjected to a B-defect annihilation process, wherein the section was heated to a temperature of about 1250° C. at a rate of about 25° C., and maintained at that temperature for a hold time of about 10 seconds whereas the other section was not subjected to a B-defect annihilation process. Both sections were then treated with the B-defect delineating test discussed earlier and a digital image was taken of each delineated section. As shown in FIG. 1, the wafer section subjected to the annihilation process (i.e. the section on the right in FIG. 1) is substantially free of B-defects whereas the section of a wafer that was not subjected to the B-defect annihilation process (i.e., the section on the left in FIG. 1) contains B-defects, which appear as white dots in the center of the wafer.

Additional wafers, wafers 1 through 12 in Table 1, from the same section of the crystal were then treated with various heat treatment processes wherein each wafer was heated at a rate of approximately 25° C./min to a target temperature and for a specified period of time as described in Table 1.

TABLE 1

| Wafer No. | Heat Treatment Target Temperature (° C.)/ Hold Time (sec) | Ambient | Comment | B-defect Present (Y/N) |
|---|---|---|---|---|
| 1 | 1000/300 | Ar plus 500 ppm O$_2$ | | Y |
| 2 | 1100/15 | Ar plus 500 ppm O$_2$ | | Y |
| 3 | 1100/60 | Ar plus 500 ppm O$_2$ | | Y (very few) |
| 4 | 1250/10 | Ar plus 500 ppm O$_2$ | 10 C/s Rampdown | Indeterminate |

TABLE 1-continued

| Wafer No. | Heat Treatment Target Temperature (° C.)/ Hold Time (sec) | Ambient | Comment | B-defect Present (Y/N) |
|---|---|---|---|---|
| 5 | 1150/60 | Ar plus 500 ppm O$_2$ | | N |
| 6 | 1200/60 | Ar plus 500 ppm O$_2$ | | N |
| 7 | 1175/60 | Ar plus 500 ppm O$_2$ | | N |
| 8 | 1250/10 | Ar plus 500 ppm O$_2$ | 5 C/s Rampdown | N |
| 9 | 1250/10 | O$_2$ | 10 C/s Rampdown | N |
| 10 | 1250/10 | O$_2$ | 10 C/s Rampdown | N |
| 11 | 1250/10 | Ar plus 500 ppm O$_2$ | | N |
| 12 | 1250/10 | Ar plus 500 ppm O$_2$ | | N |

The wafers were then cooled to room temperature. Significantly, after being heated to a target temperature of 1000° C. for 5 minutes, wafer 1 shows a significant number of B-defects; when heated to 1100° C. for 15 seconds, wafer 2 shows considerably less B-defects; and when heated to 1100 ° C. for 60 seconds, wafer 3 shows almost no B-defects. (See FIG. 2.) Thus, as demonstrated by wafers 1 through 3, as the target temperature is increased to above 1100° C., the B-defects are significantly reduced, and given a sufficient hold time, are almost completely eliminated. Additionally, as shown in wafers 5 through 12, the B-defects may be annihilated when heated to temperatures above 1150, 1175, 1200 and 1250 and held for time periods ranging from about 10 to about 60 seconds. (See Table 1 and FIGS. 2(e) through 2(l).)

Wafer 4 was treated according to an ideal precipitating wafer process wherein the temperature was increased at a rate of about 25° C./min, the target temperature was about 1250° C., the hold time was about 10 seconds, and the cool down rate was about 10° C./min. While wafer 4 shows a significant number of white dots when subjected to the copper decoration method as shown in FIG. 2(d), it is believed that the ideal precipitation sites were decorated by the copper decoration method and appear as white dots, such that even though the B-defects were annihilated in the process, the image of wafer 4 still shows white dots across the surface of the wafer. To support this assumption, wafers 8 through 12 were subjected to the same temperature and hold time as wafer 4, however either the ambient or the cool down rate was varied such that the ideal precipitation sites were not formed. Wafers 8 through 12 show that B-defects are annihilated when a wafer is heated at a rate of about 25° C./min to a temperature of about 1250° C. and held there for about 10 seconds, thus supporting the assumption that the white dots shown in wafer 4 are actually decorated ideal precipitation sites.

In view of the above, it will be seen that the several objects of the invention are achieved. As various changes could be made in the above-described process without departing from the scope of the invention, it is intended that all matters contained in the above description be interpreted as illustrative and not in a limiting sense. In addition, when introducing elements of the present invention or the preferred embodiment(s) thereof, the articles "a," "an," "the" and "said" are intended to mean that there are one or more of the elements. The terms "comprising," "including" and

We claim:

1. A process for heat treating a silicon wafer to dissolve B-defects in the silicon wafer, the process comprising:

heating a wafer comprising B-defects which have not been stabilized and which are capable of being dissolved to a heat-treatment temperature sufficient to dissolve B-defects, such that as part of the heating step, the wafer temperature is increased through a range of temperatures at which B-defects can grow and can become stabilized, at a heating rate sufficient to prevent the stabilization of the B-defects; and, maintaining the wafer at the heat-treatment temperature for a time period sufficient to dissolve the B-defects.

2. The process of claim 1 wherein the heat-treatment temperature is at least about 1000° C.

3. The process of claim 2 wherein the time period is at least about 2 seconds.

4. The process of claim 2 wherein the time period is at least about 15 seconds.

5. The process of claim 2 wherein the time period is at least about 30 seconds.

6. The process of claim 1 wherein the heat-treatment temperature is at least about 1100° C.

7. The process of claim 6 wherein the time period is at least about 2 seconds.

8. The process of claim 6 wherein the time period is at least about 15 seconds.

9. The process of claim 6 wherein the time period is at least about 30 seconds.

10. The process of claim 1 wherein the heat-treatment temperature is at least about 1200° C.

11. The process of claim 10 wherein the time period is at least about 2 seconds.

12. The process of claim 10 wherein the time period is at least about 15 seconds.

13. The process of claim 10 wherein the time period is at least about 30 seconds.

14. The process of claim 1 wherein the heat-treatment temperature is at least about 1250° C.

15. The process of claim 14 wherein the time period is at least about 2 seconds.

16. The process of claim 14 wherein the time period is at least about 5 seconds.

17. The process of claim 14 wherein the time period is at least about 15 seconds.

18. The process of claim 14 wherein the time period is at least about 30 seconds.

19. The process of claim 1 wherein range of temperatures at which B-defects can grow and can become stabilized is at least about 500° C. to about 1000° C.

20. The process of claim 19 wherein the heating rate is at least about 5° C. per second.

21. The process of claim 19 wherein the heating rate is at least about 15° C. per second.

22. The process of claim 19 wherein the heating rate is at least about 25° C. per second.

23. The process of claim 1 wherein range of temperatures at which B-defects can grow and can become stabilized is at least about 900° C. to about 1000° C.

24. The process of claim 23 wherein the heating rate is at least about 5° C. per second.

25. The process of claim 23 wherein the heating rate is at least about 15° C. per second.

26. The process of claim 23 wherein the heating rate is at least about 25° C. per second.

27. The process of claim 1 wherein the time period is at least about 2 seconds.

28. The process of claim 1 wherein the time period is at least about 5 seconds.

29. The process of claim 1 wherein the time period is at least about 10 seconds.

30. The process of claim 1 wherein the time period is at least about 20 seconds.

31. The process of claim 1 wherein the time period is at least about 40 seconds.

32. A process for heat-treating a single crystal silicon wafer to dissolve B-defects in the wafer and to influence the precipitation behavior of oxygen in the wafer in a subsequent thermal processing step, the silicon wafer comprising B-defects which have not been stabilized and which are capable of being dissolved and having a front surface, a back surface, a central plane between the front and back surfaces, a front surface layer which comprises the region of the wafer between the front surface and a distance, D, measured from the front surface and toward the central plane, and a bulk layer which comprises the region of the wafer between the central plane and front surface layer, the process comprising the steps of:

heating the wafer comprising said B-defects to a heat-treatment temperature of at least about 1150° C. to dissolve the B-defects and to form crystal lattice vacancies in the surface and bulk layers, such that as part of the heating step, the wafer temperature is increased through a range of temperatures at which B-defects can grow and can become stabilized, at a heating rate sufficient to prevent the stabilization of the B-defects;

maintaining the wafer at the heat-treatment temperature for a time period sufficient to dissolve the B-defects; and, controlling the cooling rate of the heat-treated wafer to cause the formation of a vacancy concentration profile in the wafer, in which the peak density is at or near the central plane with the concentration generally decreasing in the direction of the front surface of the wafer and the difference in the concentration of vacancies in the front surface and bulk layers being such that a thermal treatment at a temperature in excess of 750° C., is capable of forming in the wafer a denuded zone in the front surface layer and oxygen clusters or precipitates in the bulk layer with the concentration of the oxygen clusters or precipitates in the bulk layer being primarily dependant upon the concentration of vacancies.

33. The process of claim 32 wherein the heat-treatment temperature is at least about 1200° C.

34. The process of claim 33 wherein the time period is at least about 2 seconds.

35. The process of claim 33 wherein the time period is at least about 15 seconds.

36. The process of claim 33 wherein the time period is at least about 30 seconds.

37. The process of claim 32 wherein the heat-treatment temperature is at least about 1250° C.

38. The process of claim 37 wherein the time period is at least about 2 seconds.

39. The process of claim 37 wherein the time period is at least about 15 seconds.

40. The process of claim 37 wherein the time period is at least about 30 seconds.

41. The process of claim 32 wherein range of temperatures range of temperatures at which B-defects can grow and can become stabilized is at least about 500° C. to about 1000° C.

42. The process of claim 41 wherein the heating rate is at least about 5° C. per second.

43. The process of claim 41 wherein the heating rate is at least about 15° C. per second.

44. The process of claim 41 wherein the heating rate is at least about 25° C. per second.

45. The process of claim 32 wherein range of temperatures range of temperatures at which B-defects can grow and can become stabilized is at least about 900° C. to about 1000° C.

46. The process of claim 45 wherein the heating rate is at least about 5° C. per second.

47. The process of claim 45 wherein the heating rate is at least about 15° C. per second.

48. The process of claim 45 wherein the heating rate is at least about 25° C. per second.

49. The process of claim 32 wherein the time period is at least about 2 seconds.

50. The process of claim 32 wherein the time period is at least about 5 seconds.

51. The process of claim 32 wherein the time period is at least about 10 seconds.

52. The process of claim 32 wherein the time period is at least about 40 seconds or greater.

53. The process of claim 32 wherein the cooling rate is at least about 20° C. per second through the temperature range at which crystal lattice vacancies are relatively mobile in silicon.

54. The process of claim 32 wherein the cooling rate is at least about 50° C. per second through the temperature range at which crystal lattice vacancies are relatively mobile in silicon.

55. The process of claim 32 wherein the cooling rate is at least about 100° C. per second through the temperature range at which crystal lattice vacancies are relatively mobile in silicon.

* * * * *

UNITED STATES PATENT AND TRADEMARK OFFICE
CERTIFICATE OF CORRECTION

PATENT NO. : 6,635,587 B1
DATED : October 21, 2003
INVENTOR(S) : Luciano Mule'Stagno et al.

It is certified that error appears in the above-identified patent and that said Letters Patent is hereby corrected as shown below:

Column 10,
Lines 64-65, "wherein range of temperatures range of temperatures at" should read -- wherein range of temperatures at --.

Column 11,
Lines 7-8, "wherein range of temperatures range of temperatures at" should read -- wherein range of temperatures at --.

Signed and Sealed this

Thirteenth Day of January, 2004

JON W. DUDAS
*Acting Director of the United States Patent and Trademark Office*